_United States Patent_ [19]

Tedd et al.

[11] Patent Number: 4,604,569
[45] Date of Patent: Aug. 5, 1986

[54] MULTIMETERS

[75] Inventors: David C. Tedd, Folkestone; David M. Kennedy, Hythe, both of England

[73] Assignee: Thorn EMI Instruments Limited, Dover, England

[21] Appl. No.: 510,353

[22] Filed: Jul. 1, 1983

[30] Foreign Application Priority Data

Jul. 2, 1982 [GB] United Kingdom ............... 8219252

[51] Int. Cl.⁴ .......................................... G01R 15/12
[52] U.S. Cl. ................................. 324/73 R; 324/110; 324/115; 340/540
[58] Field of Search ................ 324/73 R, 115, 158 R, 324/110; 340/540, 686, 687, 688

[56] References Cited

FOREIGN PATENT DOCUMENTS 55-147355 11/1980 Japan ................................ 324/73 R

OTHER PUBLICATIONS

Barker, R. et al., "Contemporary Design Practice in General-Purpose Digital Multimeters", Hewlett-Packard Journal, vol. 28(6), Feb. 1977, pp. 20-27, Hioki E.E. Corp., Catalog No. 3207E, Jan. 1980.

Primary Examiner—Stewart J. Levy
Assistant Examiner—Stephen M. Baker
Attorney, Agent, or Firm—Fleit, Jacobson, Cohn & Price

[57] ABSTRACT

A multimeter is provided with two slide switches, one switch providing a selection of four functions, i.e. "OFF", "AC", "DC/JUNCTION" and "RESISTANCE/CONTINUITY" and the other switch providing a selection of six range settings and a "JUNCTION/CONTINUITY" setting. The multimeter also has three input sockets for insertion of test leads. At least two of the combinations of the switches and sockets are incompatible, i.e. "AC" and "JUNCTION/CONTINUITY", and a current input socket and "RESISTANCE/CONTINUITY". An internal buzzer is incorporated in the multimeter to provide an audible indication to a user that an incompatible combination has been selected. The buzzer is preferably also used in junction and continuity test modes.

12 Claims, 3 Drawing Figures

MULTIMETERS

This invention relates to multimeters and, in particular, though not exclusively, to such meters which incorporate measurement functions such as voltage, current, resistance, continuity and semiconductor testing.

Such meters may include a selection of function switches, such as "OFF", "AC", "DC/JUNCTION" and "RESISTANCE/CONTINUITY" and a selection of range switches to provide various range settings and may also include a "JUNCTION/CONTINUITY" range switch.

In addition to these switches, such meters may be provided with a number of separate sockets for measuring current, voltage, resistance, etc., into which a test lead can be inserted.

Thus, by operation of the switches and selection of a particular socket, a substantial number of different combinations for various measurements are provided by the multimeter.

However, a number of these combinations are incompatible and problems may arise when a user of the meter is unaware which combinations cannot be used, or even that such incompatible combinations exist at all.

It is therefore an object of the present invention to provide a multimeter which substantially alleviates the afore-mentioned problem.

According to the invention there is provided a multimeter, comprising user-operable means for selecting various combinations of measurement functions, and further means for detecting when an incompatible combination has been selected and for providing an indication to the user that such a combination has been selected.

Preferably, an audible indication is provided such as a buzzer, which is activated when an incompatible combination is selected by the user.

The invention will now be further described by way of example only with peference to the accompanying diagrams, wherein.

Figure 1:
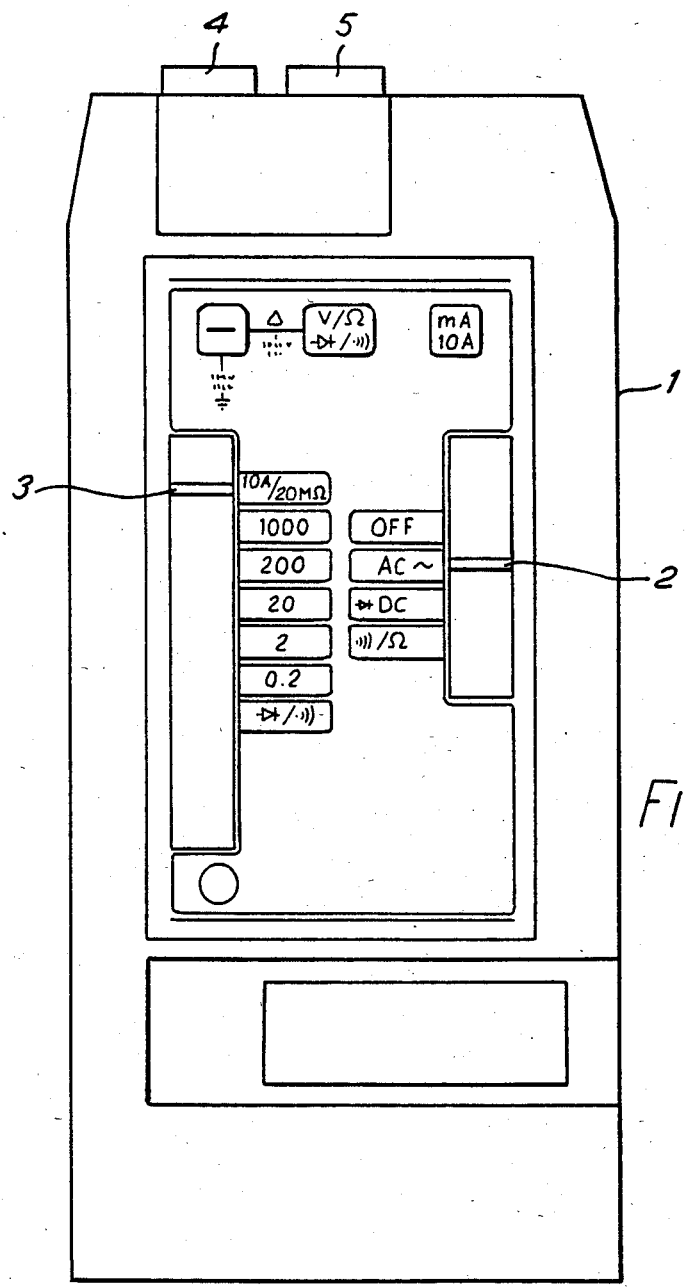
FIG. 1 shows a multimeter incorporating an embodiment of the invention.

Referring to FIG. 1, a multimeter 1 is provided with two slide switches 2 and 3, slide switch 2 providing a selection of four functions, i.e. "OFF", "AC", "DC/JUNCTION" and "RESISTANCE/CONTINUITY", and slide switch 3 providing a selection of six range settings and a "JUNCTION/CONTINUITY" setting.

Multimeter 1 also provides a common input socket 4, an input socket 5 for voltage and resistance measurements, and a third, recessed, socket (not shown on the diagram) for current measurement, into any one of which a test lead may be inserted.

A user of the multimeter can therefore choose any combination of the input sockets and the positions of slide switches, 2 and 3.

However, at least two of these combinations are incompatible. These incompatible combinations are the "AC" position on switch 2 and the "JUNCTION/CONTINUITY" position on switch 3, because junction measurement requires DC, and also the current input socket and the "RESISTANCE/CONTINUITY" position of switch 2, because resistance measurement requires the use of the voltage input socket.

The multimeter is already provided with an internal 3 KHz buzzer (not shown in the diagram) for use in the junction and continuity test modes, so the same buzzer is preferably also employed to indicate to the user that he has chosen one of the above-mentioned incompatible combinations.

Figure 2:
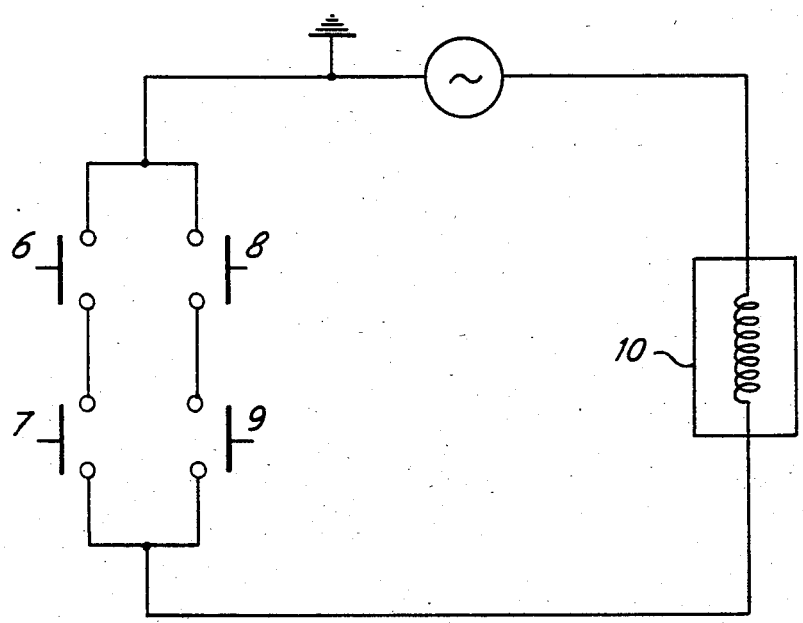
FIG. 2 shows a schematic circuit diagram which may be utilised in accordance with the present invention.

A person skilled in the art will appreciate that there are many circuit arrangements that could be utilised in accordance with the present invention and one such arrangement is shown in FIG. 2.

Switch 6, in FIG. 2, is closed when the current input socket is selected for insertion of the test lead, switch 7 is closed when the "RESISTANCE/CONTINUITY" position of slide switch 2 (on FIG. 1) is selected, switch 8 is closed when the "AC" position of slide switch 2 is selected, and switch 9 is closed when the "JUNCTION/CONTINUITY" position of slide switch 3 (on FIG. 1) is selected.

Consequently, when both the current input socket and the "RESISTANCE/CONTINUITY" position are selected together, switches 6 and 7 are closed thus completing the circuit and activating buzzer 10 to provide an audible indication to the user that the combination he has chosen is incompatible.

Similarly, if the "AC" position and the "JUNCTION/CONTINUITY" position are selected simultaneously, switches 8 and 9 will both be closed, thereby completing the circuit and again activating the buzzer 10 to provide an audible indication that such a combination is incompatible.

If, as in the preferred embodiment, the buzzer is used for other purposes, in addition to being used as an audible indication, then it may be advantageous to modulate the audible indication signal in some way, so that the user can easily distinguish for which purpose the buzzer has been activated.

Figure 3:
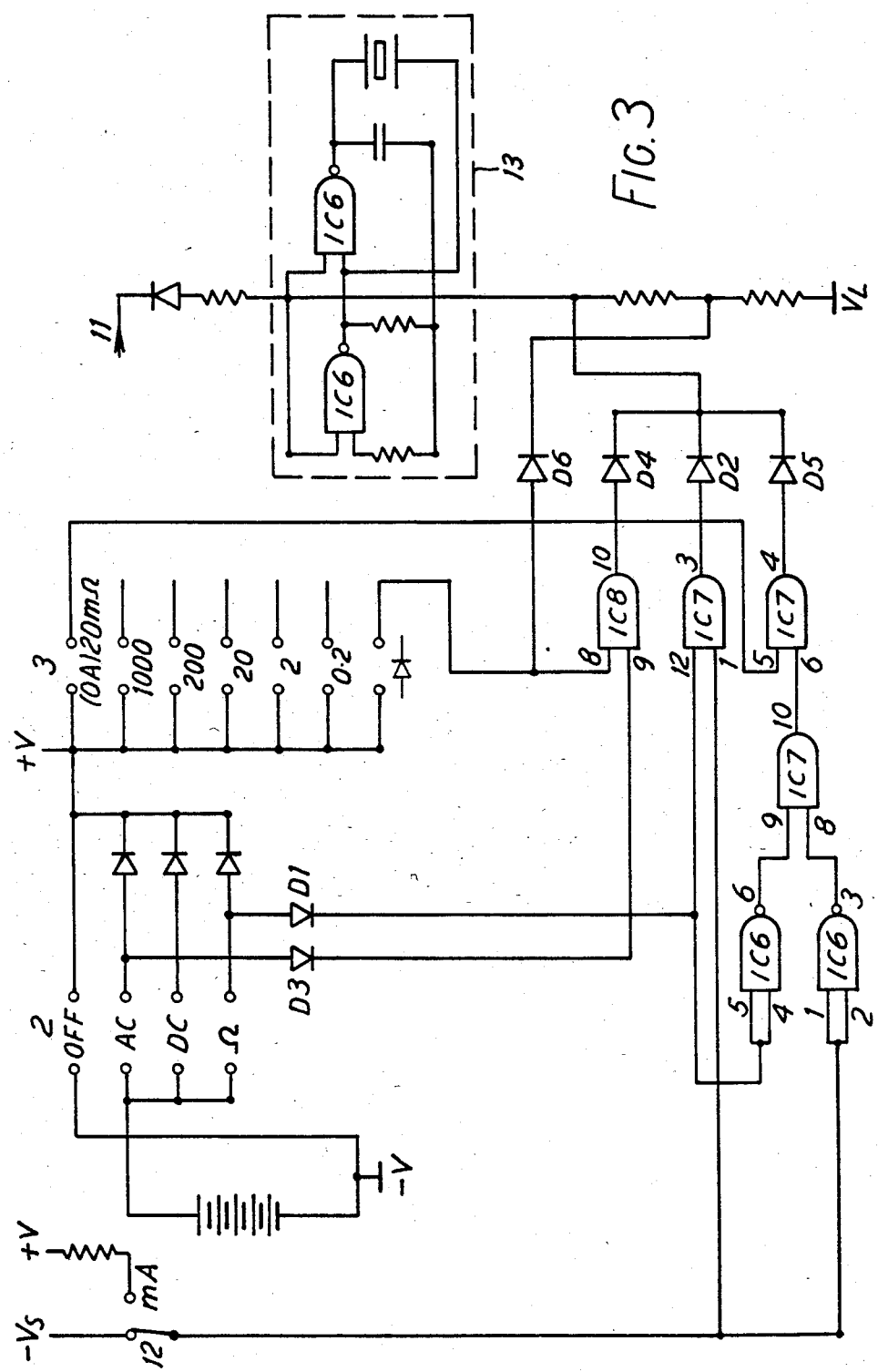
FIG. 3 shows a more detailed circuit diagram in accordance with one example of the invention.

FIG. 3 shows a more detailed circuit diagram in accordance with an example of the present invention. FIG. 3 shows the slide switches, 2 and 3, having four and seven positions, respectively. Switch 12 is moved from $-V_s$ to $+V$ by the pressure of a lead being inserted in the current socket.

A buzzer input is shown at 11 and this input is passed to an oscillator 13, which is preferably of the type described in our copending application Ser. No. 8219857.

The buzzer is activated in any of the following circumstances:

(a) when a lead is in the current socket and "RESISTANCE/CONTINUITY" "Ω" position of switch 2 is selected, input 1 of IC7 is connected to $+V$, via switch 12, so that input 1 is high. Input 12 of IC7 is also high, as it is connected to $+V_L$, via diode D1 and bridged contacts "Ω". Output 3 of IC7 is consequently high and thus diode D2 conducts to activate the oscillator 13.

(b) when "AC" position of switch 2 and "JUNCTION/CONTINUITY" " " position of switch 3 are selected, input 8 of IC8 is connected to $+V$ via bridged contacts " ", and is therefore high. Input 9 of IC8 is also high, as it is connected to diode D3 and bridged contacts "AC". Output 10 of IC8 is thus high and activates the oscillator 13, via diode D4.

(c) when "10A/20mΩ" position of switch 3 is selected and a lead is not inserted in the current socket, inputs 1 and 2 of IC6 are both low, as they are connected to $-V_S$, because a lead has not been inserted. Output 3 of IC6 and input 8 of IC7 are therefore high. If either of the "AC" or "DC" positions are selected on switch 2, inputs 4 and 5 of IC6 would still remain low, because they are connected to the non-selected "Ω" position. Output 6 of IC6 and input 9 of IC7 are therefore high. With inputs 8 and 9 of IC7 high, output 10 of IC7 and input 6 of IC7 are also high. Output 4 of IC7 is therefore high, which thus activates the oscillator 13, via diode D5.

The oscillator 13 can also be activated when the " " position of switch 3 is selected, as $+V$ is applied to the oscillator 13 via diode D6.

We claim:

1. A multimeter comprising a first user-operable switching means for selecting one of a first group of different measurement functions, a second user-operable switching means for selecting one of a second group of different measurement functions and further means, responsive to said first and second switching means to initiate an indication, perceptible by a user, whenever said respective measurement functions, selected from said first and second groups, are incompatible with one another.

2. A multimeter comprising an input socket for receiving an input lead, a user-operable switching means for selecting one of a group of different measurement functions, a further switching means the state of which depends on the presence or absence of said input lead in said input socket and means responsive to said user-operable switching means and said further switching means to initiate an indication, perceptible by a user, whenever the state of said further switching means is incompatible with said measurement function selected by said user-operable switching means.

3. A multimeter as claimed in claim 1 wherein said indication is audible to said user.

4. A multimeter as claimed in claim 3 wherein said audible indication is adapted to provide a further audible indication during implementation of at least one compatible combination of measurement functions selected by said user.

5. A multimeter as claimed in claim 4 wherein said further audible indication is modulated relative to said first-mentioned audible indication, so that said user can distinguish for which purpose said audible indication has been activated.

6. A multimeter as claimed in claim 3 wherein said audible indication consists of an internal buzzer.

7. A multimeter as claimed in claim 1 wherein said further means comprises a plurality of switches, each of said switches corresponding to a predetermined function, so that selection of a function causes actuation of said corresponding switch, said plurality of switches being connected so as to cause activation of said indication when an incompatible combination has been selected.

8. A multimeter as claimed in claim 1 wherein each said user-operable switching means comprises a slideably-operated multiposition switch.

9. A multimeter as claimed in claim 2 wherein said user-operable switching means comprises a slideably-operated multiposition switch.

10. A multimeter as claimed in claim 2 wherein said indication is audible to said user.

11. A multimeter as claimed in claim 10 wherein said audible indication is adapted to provide a further audible indication during implementation of at least one compatible combination of measurement functions selected by said user.

12. A multimeter as claimed in claim 11 wherein said further audible indication is modulated relative to said first mentioned audible indication, so that said user can distinguish for which purpose said audible indication has been activated.

* * * * *